United States Patent [19]
Duval et al.

[11] Patent Number: 6,139,627
[45] Date of Patent: Oct. 31, 2000

[54] TRANSPARENT MULTI-ZONE CRYSTAL GROWTH FURNACE AND METHOD FOR CONTROLLING THE SAME

[75] Inventors: Walter Duval, Lakewood; Celal Batur, Fairlawn; Robert J. Bennett, Birmingham, all of Ohio

[73] Assignee: The University of Akron

[21] Appl. No.: 09/157,820

[22] Filed: Sep. 21, 1998

[51] Int. Cl.[7] ................................. C30B 35/00
[52] U.S. Cl. ....................... 117/81; 117/37; 117/83; 219/390; 219/411; 364/557; 364/486
[58] Field of Search ................... 117/37, 81, 83; 219/390, 411, 486; 364/557

[56] References Cited

U.S. PATENT DOCUMENTS

| | | | |
|---|---|---|---|
| 3,626,154 | 12/1971 | Reed | 219/411 |
| 4,011,430 | 3/1977 | Witkin et al. | 219/486 |
| 4,565,917 | 1/1986 | Furtek | 219/388 |
| 4,654,502 | 3/1987 | Furtek | 219/85 BM |
| 4,711,989 | 12/1987 | Yu | 219/390 |
| 4,833,301 | 5/1989 | Furtek | 219/388 |
| 4,907,177 | 3/1990 | Curreri et al. | 364/557 |
| 4,952,780 | 8/1990 | Currreri et al. | 219/390 |
| 5,611,856 | 3/1997 | Schunemann et al. | 117/37 |
| 5,676,869 | 10/1997 | Nakayama et al. | 219/390 |
| 5,715,361 | 2/1998 | Moslehi | 392/416 |

FOREIGN PATENT DOCUMENTS

| | | |
|---|---|---|
| 40 3065710A | 3/1991 | Japan . |
| 407006955A | 1/1995 | Japan . |
| 410199822A | 7/1998 | Japan . |

*Primary Examiner*—Felisa Hiteshew
*Attorney, Agent, or Firm*—Renner Kenner Greive Bobak Taylor & Weber

[57] ABSTRACT

A crystal growth system, comprising: a furnace; a plurality of heating elements coupled to said furnace, each said plurality of heating elements defining a heat zone, each said heating element set to a desired temperature value; a plurality of thermocouples associated with respective heat zones to detect a temperature value; a translation system for passing an ampoule containing crystal growth material through said furnace into said heat zones and providing a positional location of said ampoule and; a multi-variable self-tuning temperature controller connected to said plurality of heating elements, said plurality of thermocouples and said translation system, said controller monitoring each said zone temperature value and upon considering the thermal interaction of heating zones and the moving thermal inertia of the ampoule, adjusting voltage input to said heat zones to obtain optimal crystal growth within said ampoule.

17 Claims, 4 Drawing Sheets

TRANSPARENT MULTI-ZONE CRYSTAL GROWTH FURNACE AND METHOD FOR CONTROLLING THE SAME

GOVERNMENTAL RIGHTS

The U.S. Government has a paid-up license in this invention and may have the right in limited circumstances to require the patent owner to license others on reasonable terms as provided for by the terms of Grant No. NCC 3-567 awarded by NASA.

TECHNICAL FIELD

The present invention relates generally to crystal growth furnaces and in particular to a vertical multi-zone transparent crystal growth furnace. More specifically, the present invention is directed toward a self-tuning furnace that accounts for zone to zone thermal interactions.

BACKGROUND OF THE INVENTION

Lead bromide crystals are used to produce an acousto-optical tunable filter of very high optical quality. These crystals are used to filter laser light waves that pass therethrough without distortion. Any non-homogeneity severely diminishes the effectiveness of such a crystal.

In a crystal growth furnace, materials are placed in an ampoule heated until liquified and cooled under controlled conditions allowing a crystal to grow. Careful control of the heating and cooling conditions improves the quality of the crystal. The crystals begin to form at a solidification point during the growth process. At this point an interface exists between the liquid material and the crystallized material. The shape of the interface is directly related to the quality of the crystal formed. The most preferable shape is a flat surface (flat interface) between the liquid and solid phases. A flat interface indicates a crystal free of impurities and defects in its structure. Convex and concave shapes indicate the likelihood of thermal stresses which can decrease the quality of crystal.

Traditionally, a two zone Bridgman type furnace is used for lead bromide crystal growth. To achieve requisite crystal homogenity, for the acousto-optical tunable filter application, the crystal growth must exhibit a flat interface between the solid and liquid phases. The Bridgman furnace is a vertical furnace with a hot and cold zone. The hot and cold zones create a thermal gradient therebetween. Insulation is used in traditional designs in and around the furnace maintaining axial heat flow to create a nearly-flat interface. The presence of insulation prevents observation of the interface and adjustment of the thermal characteristics of the furnace to compensate for any change in the interface shape. Thus, the traditional Bridgman furnace lacks the versatility for optimal control of crystal growth parameters necessary for producing crystals of sufficient quality for acousto-optical tunable filters.

Visual monitoring of the interface is important for commercial applications and as a research tool to study interface dynamics. Visual monitoring allows the observer to adjust the thermal profile inside the furnace in order to insure high quality crystals. Also, for educational purposes, observation of the crystal as it is formed allows students to observe the relation between the thermal conditions within the furnace and the interface shape.

Multiple-zone furnaces can be used to create individual heat zones capable of controlling the growth of the crystal without using insulation between the zones. It is known to use proportional, integral, derivative controllers to regulate the temperature at each zone. Proportional, integral, derivative control cannot account for zone to zone thermal interaction and the thermal inertia of the ampoule as it translates through the furnace. Traditionally, multiple zone furnaces have failed to provide a controller that accounts for these thermal interactions and thus, the parameters to grow crystals were severely limited. Thus it is desirable to have a system that will precisely control the zone temperatures accounting for zone to zone thermal interactions and the thermal inertia of the ampoule.

Crystal growth is generally performed by moving an ampoule containing the crystal growth material physically through the hot and cold zones. Crystal quality and interface shape can be affected by any disruption of the movement of the ampoule through the heating zones. The crystal growth process requires the ampoule move at an extremely slow pace through the furnace. At times, the growth process can take up to a week or more. It is known to use stepper motors to control the translation of the ampoule. The stepper motor allows very slow translation through the heat zones, but produces a jerky motion of the ampoule. The jerks created by a stepper motor are detrimental to the quality of the crystal produced for extremely slow translation rates. Thus it is desirable to use a translation system that provides slow continuous (jerk free) motion.

The rate of translation through the zones can affect the growth rate and interface quality of the crystal. To control the growth rate and interface quality, it is desirable to control translation in response to changes in the thermal dynamics within the furnace.

To avoid moving the ampoule through the heat zones physically, it is possible to create an electro dynamic gradient. In effect, the electro dynamic gradient moves the thermal profile past the ampoule without having to move the ampoule physically. Multiple zone furnaces are capable of this effect. However, moving the heat zones increases the zone to zone heat interaction in the furnace. Traditional furnaces do not account for these interactions and the crystal quality suffers. It is desirable to create a crystal growth system accounting for the zone to zone thermal interactions to produce high quality crystals by means of electro dynamic gradient.

Thus, it is desirable to construct a crystal growth furnace that provides for visual inspection and precise control of the thermal gradient accounting for zone to zone thermal interactions and thermal inertia created by the ampoule.

SUMMARY OF THE INVENTION

It is thus an object of the present invention to provide a multi-zone transparent crystal growth furnace that accounts for zone to zone thermal interaction and thermal inertia created by ampoule movement by means of a multi variable self-tuning controller.

It is another object of the invention to provide precise control of the thermal gradient eliminating the need for insulation.

It is yet another object of the invention to provide a controller that controls translation of the ampoule with respect to changes in the thermal dynamic conditions.

It is still another object of the invention to provide electro dynamic gradients with precise control and accounting for the zone to zone thermal interactions and thermal inertia of the ampoule.

It is a further object of the invention to provide smooth translation of the ampoule through the temperature zones.

It is yet a further object of the invention to have a computer based controller that models the thermal dynamic conditions within the furnace.

It is still a further object of the invention to provide power to the individual heating zones through a direct current source.

It is an additional further object of the invention to provide a transparent furnace for visual inspection of the ampoule.

It is yet an additional object of the present invention to optimally space heating elements within the furnace to allow good visual inspection of the interface.

It is still an additional further object of the invention to provide an educational tool allowing students to observe the effects on the crystal growth caused by changes in the temperature gradient within the furnace, translation of the ampoule, and disturbances to the ampoule as it passes through the furnace.

It is a further object of the invention to account for zone to zone thermal interaction and the thermal inertia of the ampoule.

The foregoing and other objects of the present invention, which shall become apparent as the detailed description proceeds, are achieved by a crystal growth system, comprising: a furnace; a plurality of heating elements coupled to said furnace, each said plurality of heating elements defining a heat zone, each said heating element set to a desired temperature value; a plurality of thermocouples associated with respective heat zones to detect a temperature value; a translation system for passing an ampoule containing crystal growth material through said furnace into said heat zones and providing a positional location of said ampoule and; a multi-variable self-tuning controller connected to said plurality of heating elements, said plurality of thermocouples and said translation system, said controller monitoring each said desired temperature value, each said heat zone temperature value and said positional location and upon considering the interaction of each, adjusting said desired temperature value to obtain optimal crystal growth within said ampoule.

Other objects of the present invention are obtained by a method for controlling the growth of a crystal in a crystal growth furnace comprising the steps of: providing a furnace with a substantially transparent inner tube having a cavity therethrough and a plurality of separate heating elements wound thereabout, each said heating element defining a heat zone, said inner tube having coupled thereto a temperature thermocouple associated with each said heat zone, said inner tube thermally insulated by a substantially transparent outer tube; inserting an ampoule filled with a crystal growth material into said cavity; energizing each said heating element to obtain a predetermined temperature gradient in each said heat zone thereby melting the crystal growth material into a liquid; monitoring the temperature of each said heat zone via said temperature thermocouples; and adjusting each said heating element to a new setting based upon the monitored temperatures of all the other heat zones so that said temperature gradient around said ampoule allows growth of crystal material from said liquid.

In general, a crystal growth system includes a transparent furnace with multiple heating zones heated by individual heating elements and a multivariable self-tuning controller.

Preferred exemplary crystal growth furnace incorporating the concepts of the present invention is shown by way of example in the accompanying drawings without attempting to show all the various forms and modifications in which the invention might be embodied, the invention being measured by the appended claims and not by the details of the specification.

DESCRIPTION OF AN EXEMPLARY EMBODIMENT

Figure 1:
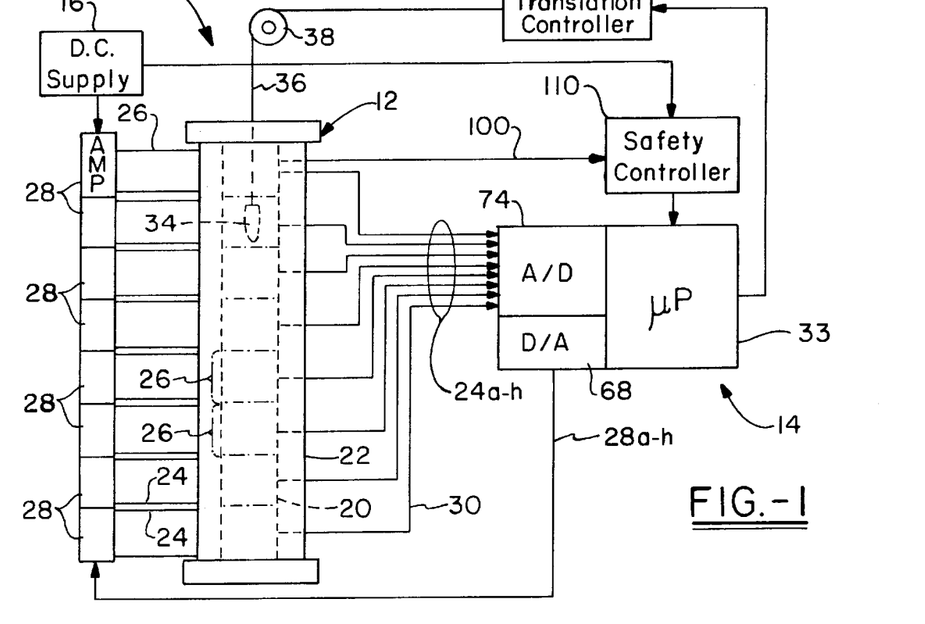
FIG. 1 is a diagram of a furnace and attached controller according to the present invention.

A crystal growth system made in accordance with the concepts of the present invention is indicated generally by the numeral 10 in the accompanying drawings. An example of the crystal growth furnace and controls is contained in Duval, Batur, and Bennett, *The Design of a Transparent Vertical Multi-Zone Furnace: Application to Crystal Growth*, NASA/TM 1998—207–412, incorporated by reference herein as if printed in its entirety. As shown in FIG. 1, the crystal growth system includes a tubular furnace 12 and a control system 14, a power source 16 and translation control system 40.

Figure 4:
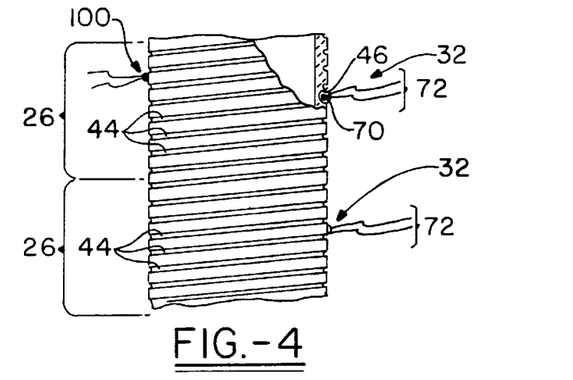
FIG. 4 is an enlarged view of a furnace inner tube.
Figure 4A:
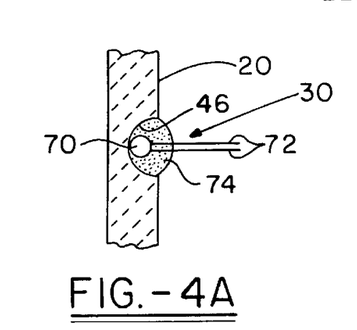
FIG. 4A is an enlarged view of a thermocouple attachment.

The furnace 12 includes an in inner tube 20 having a cavity 21. An outer tube 22, which typically has the same structural properties as the inner tube 20, surrounds and encloses the inner tube 20. The inner tube 20 carries multiple heating elements 24 defining respective heat zones 26. In particular, each heating element 24 is associated with a particular heat zone 26, wherein an alphabetic suffix defines the relationship therebetween. Other suffix designators will be utilized to further define the relationship associated with each heat zone. As such, the heating element 24a generates a desired temperature in heat zone 26a. Likewise, each heating element 24 is connected to a corresponding power amplifier 28 to increase or decrease the temperature generated about its corresponding heat zone. As best shown in FIGS. 4 and 4A, temperature thermocouples 30 are coupled to an exterior surface of the inner tube 20 at about the mid-point 32 of each respective heating zone 26. Each thermocouple 30 measures the temperature generated in the corresponding heat zone and relays its heat zone temperature value to the control system 14. The outer tube 22 provides a plurality of port holes 31 in predetermined positions to allow ingress and egress of the heating elements 24 and the lead wires associated with each thermocouple 30. In the preferred embodiment, the thermocouple 30 is a K-type thermocouple with a bead diameter of about 0.5 mm.

The control system 14, which receives electrical power from a power source (not shown), includes a microprocessor 33 that contains the necessary hardware, software and memory to control the various operational aspects of the system 10. One of ordinary skill will appreciate that the individual components of the system can receive power from a variety of sources, including AC power supplies and DC power supplies. As will be discussed in further detail, the control system 14 determines the power to each heating element 24 and the resulting temperature measured by the thermocouples 30 to ensure the manufacture of a crystal with minimal thermal stresses evidenced by a substantially flat interface between the liquid and the crystal during its growth.

The crystal growth process involves lowering an ampoule 34 which initially contains a mixture of material components into the cavity 21 for the purpose of changing the components into the desired crystal material. Movement of the ampoule 34 is controlled by the translation control system 40. One end of the ampoule 34 is connected to a thin wire 36 which passes over a pulley 38. The other end of the thin wire 36 is connected to a DC motor with a harmonic gear based speed reducer system and translation controller 40. The translation controller 40 is connected to the microprocessor 33 and to the DC power source 16. The translation controller 40 provides smooth gradual and continuous movement of the ampoule 34 through the various heat zones at a predetermined rate of speed. Use of the translation controller 40 is particularly advantageous in that it provides very minimal disruption of the heat gradient within the cavity 21.

The controller 33 monitors the system 10 by sampling the position of the ampoule 34, the power to each heating element 24, and the temperatures as measured by each thermocouple 30. The controller coordinates operation of the entire system by multi-variable, self-tuning control as will be described in more detail below.

Figures 1A, 2:
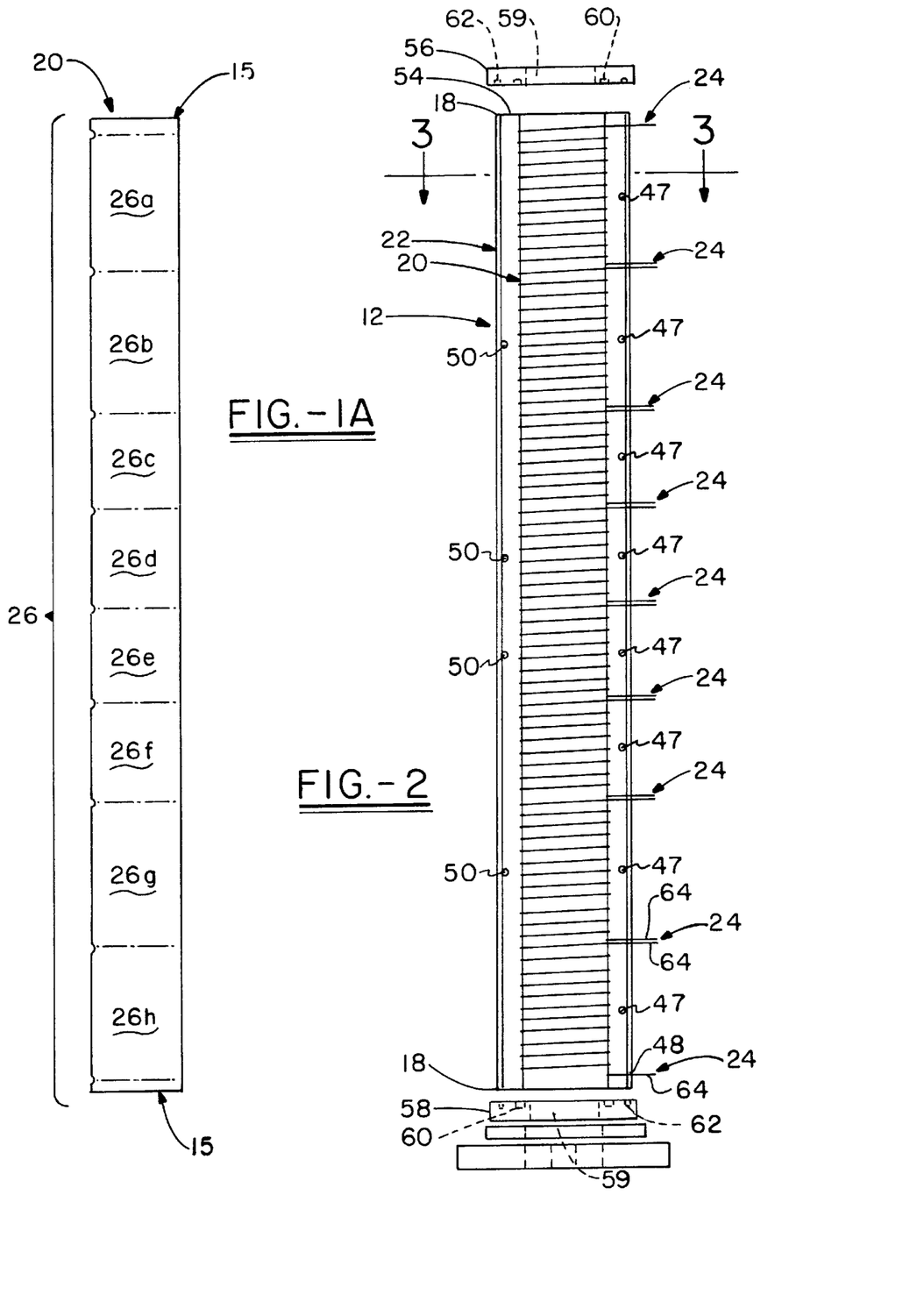
FIG. 1A is a schematic of the furnace.
FIG. 2 is a front elevational view of the furnace.
Figure 3:
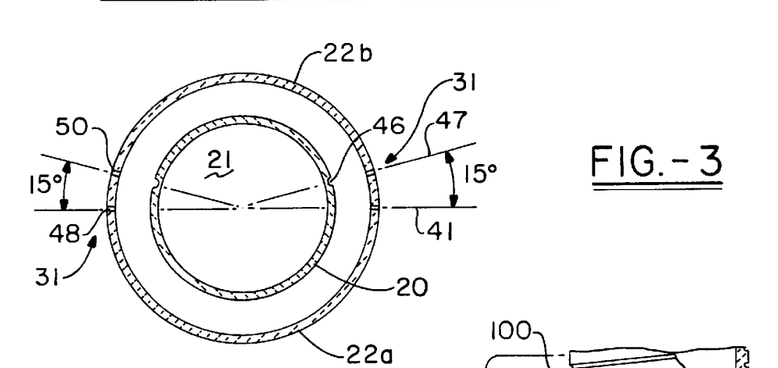
FIG. 3 is a cross-sectional view of the furnace.

With reference to FIG. 2, the inner tube 20 has a diameter of preferably about 46 mm and an inner tube wall thickness of preferably about 0.3 cm. The length of both the inner tube 20 and outer tube 22 is preferably about 52 cm. The outer tube 22 has an outer diameter of preferably about 68 mm with an inner diameter of about 64 mm. The outer tube 22 is in two sections 22a and 22b, divided along a split 41. The outer tube 22 is split into two sections to allow easy maintenance of the furnace components, such as the heating elements 24 and the temperature thermocouples 30. The outer tube 22 also functions as an insulator to maintain the desired heat distribution in the cavity 21 during the growth process and to also shield the inner tube 20 from extraneous influences.

A helical groove 44 of constant pitch is ground into an outer surface of the inner tube 20. The groove diameter is about 0.127 cm. The helical groove carries and supports each of the heating elements 24. Using a groove with a constant pitch allows for nearly uniform heat flux azimuthally. The pitch of the groove is optimized for visibility of the interface and to constrain movement of the heating elements.

As shown in FIG. 4A, blind holes 46 are drilled into the exterior surface of the inner tube 20 and do not pass all the way through the inner tube. They are merely drilled in the surface of the inner tube 20. The blind holes reduce heat loss that results from a through hole, and allow easy application and removal of thermocouples without disturbing the inside of the furnace. The holes are placed at about the midpoint of each heating zone 26, and at a position at an approximate midpoint between two adjacent heating element grooves 44. The temperature thermocouples 30 are inserted into respective blind holes 46 and held in place by an adhesive material or cement 74 that can withstand the high temperatures of the furnace. Each temperature thermocouple 30 measures the heat flux in a uniform manner at each heat zone.

As shown in the drawings, a plurality of thermocouple wire holes 47 are drilled through one section of the outer tube 22 on a line about 15 degrees from the split 41. In the exemplary device, these holes correspond to and are aligned with the thermocouple blind holes 46. Measuring from the top of the outer tube, the holes are at about 4 cm, 12 cm, 18.5 cm, 23.5 cm, 28.5 cm, 32.5 cm, 40 cm, and 48 cm. Opposite the thermocouple wire holes are safety thermocouple wire holes 50 with a diameter of about 1.6 mm and are located on a line 15 degrees from the side of the split 41. From the top 54, they are located at about 12 cm, 23.5 cm, 28.5 cm, and 40 cm. The purpose of the safety thermocouple wire holes 50 is discussed below. The outer tube 22 contains heating wire holes 48 of diameter of about 6.25 mm, and are located along the split 41 on one side of the tube. From the top 54, the heating wire holes 48 are at about 0.5 cm, 8 cm, 16 cm, 21 cm, 26 cm, 31 cm, 36 cm, 44 cm, and 51.5 cm.

A top locating ring 56 and a bottom locating ring 58 cap the inner tube 20 and outer tube 22. Each ring defines a center hole 59 capable of receiving the ampoule 34. As best shown in FIG. 2, the top locating ring 56 contains an inner circular notch 60 and an outer circular notch 62 for receiving the inner tube edges 15 and outer tube edges 18, respectively. The bottom locating ring 58 is similarly circularly notched. Both rings are preferably constructed of boron nitride or like material.

Preferably eight heating elements 24 are consecutively wrapped within the groove 44. The preferred heating element is Kanthal wire. Before wrapping the wire into the groove, the heating element wires are pre-stressed to insure a tight fit and to help prevent sagging of the wires when in use. Kanthal wire was chosen in the preferred embodiment because of its low expansion within the temperature range of 25° C. to 750° C. It will be apparent to one of ordinary skill to substitute different types of wire for different temperature ranges in this furnace. Each heating element 24 has wire ends 64 that protrude through the heating holes 48, and are connected to the power source 16.

Referring to FIG. 1, it can be seen that the servo amplifiers 28 provide power to each corresponding heating element 24. The servo amplifiers 28 are powered by the DC power supply 16. The servo amplifiers 28 receive control signals from the microprocessor based process controller 33 via a digital to analog converter 68 in electrical communication with the amplifiers.

Referring back to FIG. 1A, each heating element 24 defines a corresponding heat zone 26. Zone 1 is about 75 mm, zone 2 is about 80 mm, zone 3 is about 50 mm, zone 4 is about 50 mm, zone 5 is about 50 mm, zone 6 is about 50 mm, zone 7 is about 80 mm, and zone 8 is about 75 mm. Zone lengths are optimized to achieve temperature ranges of 25° C. to 750° C. and thermal gradients of about 2° C. per cm through 45° C. per cm. Zone lengths are more compact near the interface point, which is the area in the cavity 21 where the liquid material converts into a crystal. More compact zones are used to achieve greater control of the thermal gradient and thus better control over the interface shape. The thermocouples 30 have beads 70 with a diameter of about 0.5 mm. The thermocouples 30 are attached to the inner tube 20 in their respective blind holes 46. Each thermocouple 30 has a pair of wires 72 that pass through the temperature holes 47 to an analog to digital converter 74, which is connected to microprocessor 33.

Safety thermocouples 100 run through the safety thermocouple wire holes 50 in the outer tube. These thermocouples monitor the temperature in the furnace for safety purposes.

Since, the furnace is operating for long periods of time without supervision, it is important that if the furnace malfunctions that it will be shut down immediately. The safety thermocouples monitor the temperature and are in communication with an independent safety on-off controller 110 that will shut down the furnace when temperature within the furnace exceeds a safety value.

The control system 14 regulates the crystal growth process. The microprocessor 33 implements a multi-variable self tuning controller. Multi-variable because it monitors the temperatures of eight heating zones 26 simultaneously and adjusts the voltages applied to eight heating zones simultaneously based on a thermal dynamic model of the furnace. Self-tuning because this multi-input multi-output thermal dynamic model of the furnace is automatically adjusted every sampling time that microprocessor 33 reads eight heating zone temperatures 26. An algorithm within the microprocessor 33 uses a elf-tuned, multi-variable proportional plus integral (PI) algorithm that is updated based on the thermal dynamic model of the furnace. This dynamic model is a mathematic expression that relates temperatures of all eight heating zones to voltage input to all eight heating zones. Thermal interactions among heating zones are explicitly accounted for in this mathematical model. We use the following dynamic model of the furnace for the purpose of controller design.

$$T(t)=A.T(t-1)+B.u(t-1)+e(t)$$

Where u(t) and T(t) are vectors of dimension eight for an eight zone furnace i.e., $u, T \in R^{8 \times 1}$. The vector u(t) indicates eight voltage levels at time (t) as the inputs to the servo amplifiers 28. These inputs are determined by the multi-variable projective control based PI control algorithm. The vector T(t) denotes the measured zone temperatures. The disturbance vector $e(t) \in R^8$ indicates the inevitable zone to zone thermal interactions and the effect of thermal loading. The matrices A, $B \in R^{8 \times 8}$ define the thermal dynamics of the system. The process input, determined by the temperature controller, is the voltage input into eight heating zones, i.e., $u=(u_1, u_2, \ldots, u_8)^T$.

Figure 5:
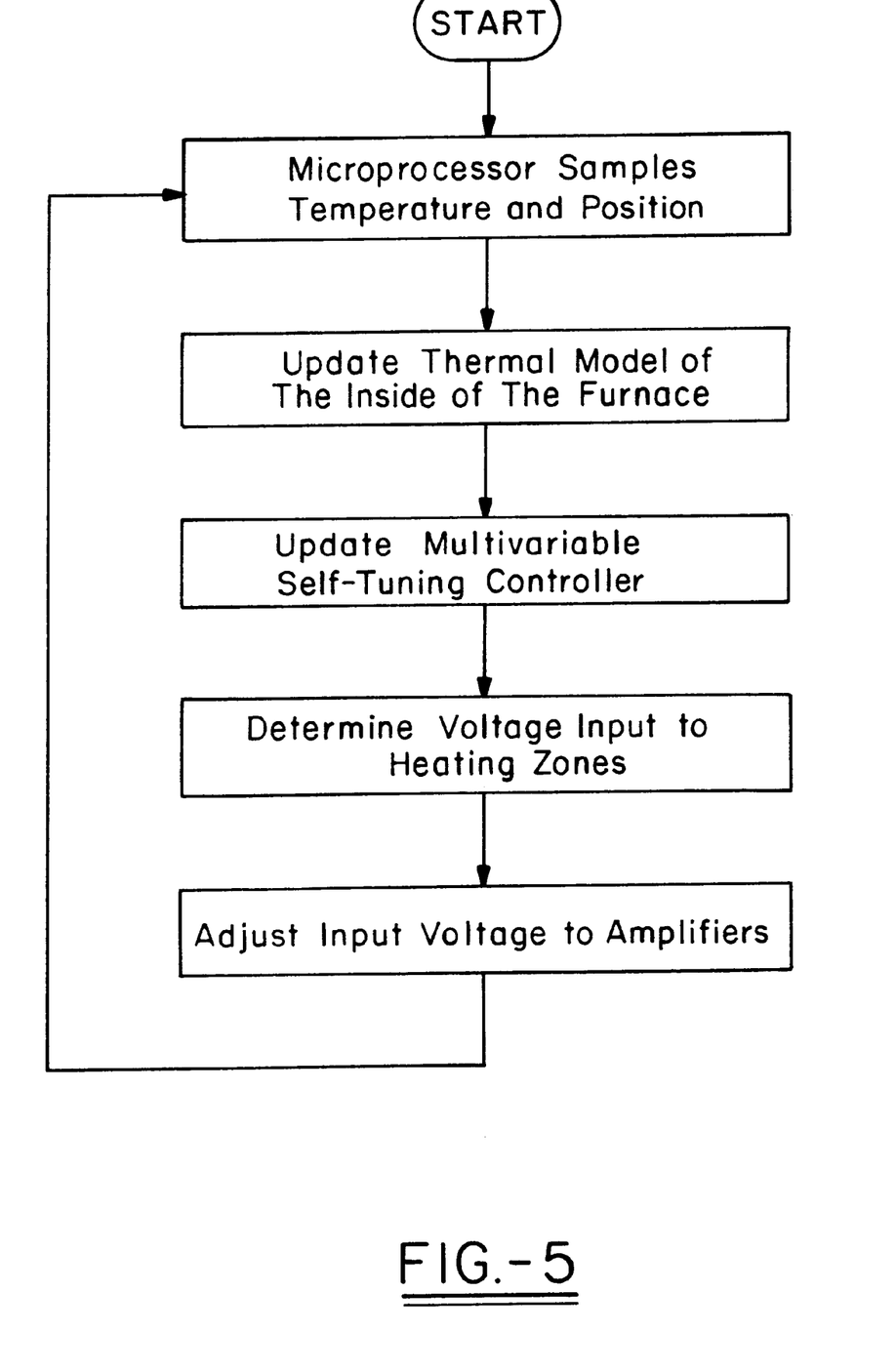
FIG. 5 is a block diagram of the control process.

As shown in FIG. 5, the microprocessor 33 periodically samples the temperature of eight zones simultaneously. These temperatures are detected by the thermocouples 30. The sampling period is normally 0.5 second but it can be adjusted by the programmer. Based on the sampled heating zone temperatures, the microprocessor 33 updates the thermal model. Updating means that the matrix coefficients in this mathematical model are determined at each sampling instant in order to update the thermal model that best represents the current sampled temperatures in the least squares sense. The model updating is based on the multi-variable Least Squares criterion, i.e., at each sampling instant the model matrices A and B are updated such that the sum of squares of the residuals are minimum, i.e., the following identification performance index is minimum $$V_{ID} = trace\left\{arg_{\hat{A},\hat{B}} mini\left[\sum_{k=1}^{t} \hat{e}(k) \cdot \hat{e}^T(k)\right]\right\}$$

where the residual of the model is given by $$\hat{e}(k)=T(t)-\hat{A}.T(t-1)-\hat{B}.u(t-1)$$

After the update, the difference between the measured heating zone temperatures and the temperatures predicted by the thermal model is minimum in a least squares sense. Once the thermal model is updated, the parameters of the PI controller are modified to take into account the most recent model of the furnace thermal dynamics. Modification of the PI control parameters is based on the linear quadratic regulator design whereby the matrices of the PI regulator are determined such that the controller minimizes a specific performance index. This index is a function of the difference between the desired temperatures in all heating zones and the actual temperatures of all heating zones. In addition, this index also contains a therm which indicates the energy input to all heating zones. Therefore, when this index is minimized, the deviations from the desired temperatures are minimized while taking into account the energy input to heating zones. It is not a good engineering practice to minimize the deviations at the expense of vary large energy inputs to heating zones. The minimization of this index determines the matrices of the PI regulator. This index is minimized at every sampling period. Therefore, the matrices of PI regulator are determined at every sampling period. Modification of the PI regulator matrices allows the fastest corrective response to thermal disturbances without causing overshoot or undershoot in the zone temperatures. These thermal disturbances are the inevitable zone to zone heat exchange and the thermal inertia of the material inside the ampoule. The PI controller determines the input voltages to the servo amplifiers 28 based on the update matrices.

Control of the individual heat zones also allows translation of the thermal gradient by changing the set-point temperatures of each zone with respect to time. This type of control can be used to perform a method of crystal growth known as electro dynamic gradient or EDG. Without moving the ampoule physically through the furnace, the temperature of the heat zones are moved around the ampoule by changing the set point temperatures. In other words, the thermal gradient is moved electronically. The self-tuning multi-variable furnace temperature controller can perform EDG by changing the set point temperatures in the individual zones and accounting for inevitable zone to zone interactions caused by heat flows among the zones.

Figure 6:
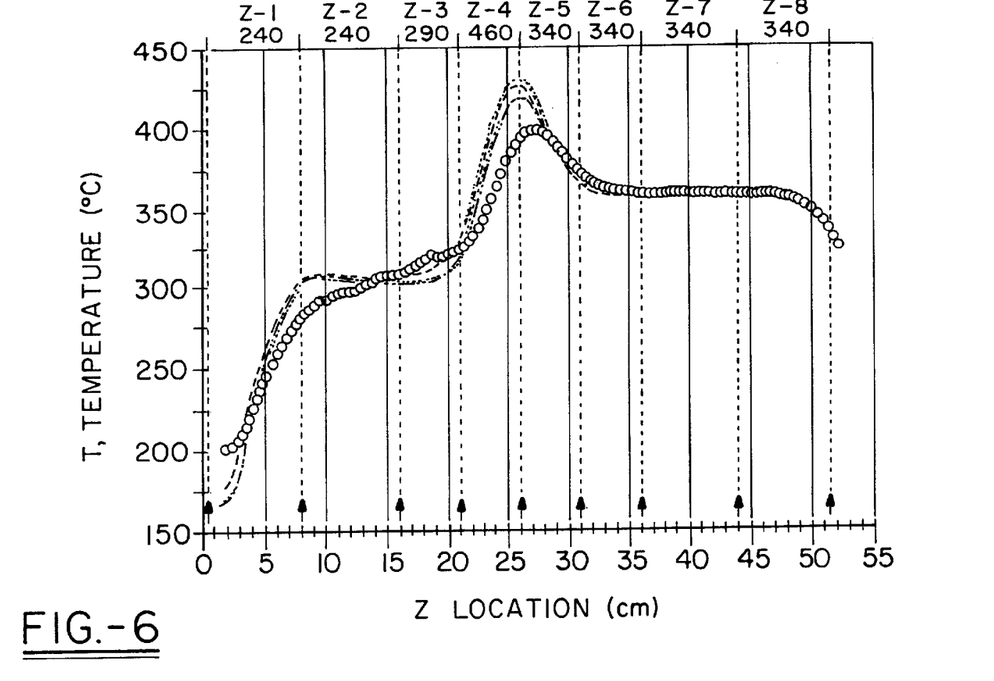
FIG. 6 is a graph of the non-linear thermal profile used for crystal growth by a physical vapor transport; and, FIG. 7 is an illustration of the multiple gradient capability with isothermal region.
Figure 7:
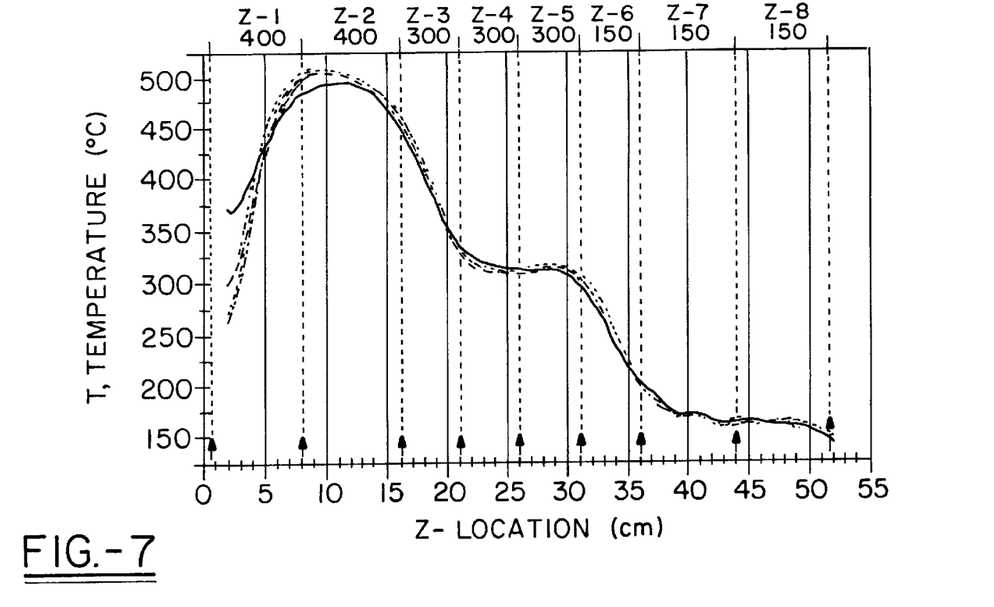

As shown in FIG. 6, the self-tuning multi-variable temperature controller can generate thermal gradients which are suitable for the physical vapor transport crystal growth. On FIGS. 6 and 7, zone numbers and set point temperatures appear along the top axis with lines indicating the start and end of each zone connected to the bottom axis. The data points represented by circles in FIG. 6 and a solid line in FIG. 7 are the temperature measured at the center of the inner tube 20. Dashed lines in both FIGS. 6 and 7 are temperatures measured along the periphery of the inner tube. Temperature measurements were taken locations along the Z axis.

As shown in FIG. 7, the controller can maintain multiple gradients in the furnace 12. The microprocessor 33 can account for zone to zone thermal interaction and respond by controlling the translation of the ampoule 34 or by changing the temperature in each heating zone 26 thereby adjusting the thermal profile within the furnace.

It should thus be evident that a crystal furnace made in accordance with the concepts of the present invention accomplishes the objects of the present invention and otherwise substantially improves the crystal growth furnace art.

What is claimed is:

1. A crystal growth system, comprising:
   a furnace, wherein said furnace comprises a substantially transparent inner quartz tube and a substantially transparent outer quartz tube surrounding said inner quartz tube;

a plurality of heating elements coupled to said furnace, each said plurality of heating elements defining a heat zone, each said heating element set to a heat value;

a plurality of thermocouples associated with respective heat zones to detect a temperature value;

a translation system for passing an ampoule containing crystal growth material through said furnace into said heat zones and providing a positional location of said ampoule and;

a multi-variable self-tuning controller connected to said plurality of heating elements, said plurality of thermocouples and said translation system, said controller monitoring each said heat value and said positional location and upon considering the interaction of each, adjusting said heat value to obtain optimal crystal growth within said ampoule.

2. A crystal growth system as in claim 1 wherein said inner tube has a helical groove and a series of blind holes are formed on an outside surface of said inner tube, said outer tube having a plurality of heating wire holes therethrough along a center line, and a plurality of thermocouple wire holes therethrough along a line offset from the center line, and plurality of safety thermocouple wire holes therethrough along a line offset from the center line.

3. A crystal growth system as in claim 2 further comprising a plurality of electrical resistance heating elements wound around the inner tube within said helical groove, and exiting through respective said heating wire holes; said thermocouples having a thermocouple bead received in respective said blind holes, said thermocouples having wires attached thereto that pass through the thermcouple wire holes and are connected to said controller.

4. A crystal growth system as in claim 1 wherein a top locating and bottom locating ring cap ends of said inner and outer tubes wherein the top locating ring and bottom locating ring are constructed of boron nitride.

5. A crystal growth system as in claim 1 wherein said heating elements are electrical resistance heating elements.

6. A crystal growth system as in claim 5 wherein said electrical resistance heating elements are Kanthal wires.

7. A crystal growth system as in claim 1 wherein the thermocouples have a diameter of about 0.5 mm.

8. A crystal growth system as in claim 1 wherein the heating elements are Kanthal wires.

9. A crystal growth system as in claim 1 wherein the power supply is a direct current power supply.

10. A crystal growth system as in claim 1 wherein the translation system is a DC motor with a harmonic gear based speed reducing system.

11. A crystal growth system as in claim 1 wherein the furnace is transparent.

12. A crystal growth system comprising:

a multi-variable self-tuning microprocessor based process temperature controller connected to a furnace, said furnace comprising:

a substantially transparent quartz inner tube having a length of about 52 cm, a diameter of about 46 mm, and a thickness of about 0.3 cm, said inner tube having an outside surface and an inside surface, said outside surface having a helical groove, having a plurality of blind holes;

an outer transparent quartz tube surrounding said inner tube, said outer tube having a length of about 52 cm, an outer diameter of about 68 mm, an inner diameter of about 64 mm, wherein said outer tube is split into a forward section and a rear section, said forward section having a plurality of thermocouple wire holes with a hole diameter of about 1.6 mm, said thermocouple wire holes are located about 4 cm, 12 cm, 18.5 cm, 23.5 cm, 28.5 cm, 32.5 cm, 40 cm, and 48 cm from the top of one of said sections, one of said sections also having a plurality of safety thermocouple wire holes having a diameter of about 1.6 mm, said safety holes are about 12 cm, 23.5 cm, 28.5 cm, and 40 cm from said top of one of said sections;

said outer tube having a plurality of heating holes formed in one of said sections, said heating wire holes having a diameter of about 6.25 mm and located at about 0.5 cm, 8 cm, 16 cm, 21 cm, 26 cm, 31 cm, 36 cm, 44 cm, and 51.5 cm from said top of one of said sections;

a top locating ring having a center hole of about 35.06 mm, said top locating ring having a ring thickness of about 1.375 cm and a pair of top locating grooves for receiving edges of the inner tube and outer tube with a depth of about 0.125 cm are formed within said top locating ring;

a bottom locating ring defining a center hole of diameter 36.06 mm and a pair of bottom locating grooves for receiving edges of the inner tube and outer tube with a depth of about 0.125 cm formed within said bottom locating ring, wherein the top locating ring and bottom locating ring are made of boron nitride, said top locating ring fitting over one end of said inner tube and said outer tube, said bottom locating ring fitting over an opposite end of said inner tube and said outer tube;

a first heating element entering through said heating wire hole at 0.5 cm and received in said helical groove and exiting at said heating wire hole at 8 cm, a second heating element entering at said heating wire hole at 8 cm and received in said helical groove and exiting said heating wire hole at 16 cm, a third heating element entering at said 16 cm heating wire hole and received in said helical groove and exiting said heating wire hole at 21 cm, a fourth element entering at said 21 cm heating wire hole and receiving in said helical groove and exiting said heating wire hole at 26 cm, a fifth heating element entering at said 26 cm heating wire hole and received in said helical groove and exiting said heating wire hole at 31 cm, a sixth element entering at said 31 cm heating wire hole and received in said helical groove and exiting said heating wire hole at 36 cm, a seventh heating element entering at said 36 cm heating wire hole and received in said helical groove and exiting at said heating wire hole at 44 cm, an eighth heating element entering at said 44 cm heating wire hole and received in said helical groove and exiting at said heating wire hole at 51.5 cm, each of said heating elements is electrically connected to said process controller which adjusts the temperature;

a plurality of safety thermocouples pass through said safety thermocouple wire holes and are in communication with an independent safety on-off temperature controller wherein if said temperature controller determines that said safety thermocouples have detected too high a temperature, said on-off temperature controller shuts off said plurality of heating elements; and a plurality of temperature thermocouples pass through said plurality of thermocouple wire holes of the outer tube and enter said corresponding plurality of blind holes located on said inner tube, wherein said temperature thermocouples are connected to said controller which individually adjusts each said heating element based on temperature detected by all said temperature thermocouples.

13. A crystal growth system comprising:

a furnace;

a plurality of heating elements coupled to said furnace, each said plurality of heating elements defining a heat zone, each said heating element set to a heat value;

a plurality of thermocouples associated with respective heat zones to detect a temperature value;

a translation system for passing an ampoule containing crystal growth material through said furnace into said heat zones and providing a positional location of said ampoule, wherein said translation system includes a DC motor with a harmonic gear based speed reducing system; and a multi-variable self-tuning controller connected to said plurality of heating elements, said plurality of thermocouples and said translation system, said controller monitoring each said heat value and said positional location and upon considering the interaction of each, adjusting said heat value to obtain optimal crystal growth within said ampoule.

14. A crystal growth system, comprising:

a transparent furnace;

a plurality of heating elements coupled to said furnace, each said plurality of heating elements defining a heat zone, each said heating element set to a heat value;

a plurality of thermocouples associated with respective heat zones to detect a temperature value;

a translation system for passing an ampoule containing crystal growth material through said furnace into said heat zones and providing a positional location of said ampoule; and a multi-variable self-tuning controller connected to said plurality of heating elements, said plurality of thermocouples and said translation system, said controller monitoring each said heat value and said positional location and upon considering the interaction of each, adjusting said heat value to obtain optimal crystal growth within said ampoule.

15. A crystal growth system as in claim 14 further comprising a helical groove formed on an outside surface of said furnace, wherein said heating elements are coupled to said furnace within said groove.

16. A crystal growth system as in claim 14, wherein said furnace includes an inner tube and an outer tube surrounding said inner tube.

17. A crystal growth system as in claim 16, wherein said outer tube is split into two sections.

* * * * *